United States Patent
Wendt et al.

(10) Patent No.: US 7,145,342 B2
(45) Date of Patent: Dec. 5, 2006

(54) SYSTEM AND METHOD FOR AUTOMATED FILAMENT TESTING OF GAS DISCHARGE LAMPS

(75) Inventors: Ernest T. Wendt, Holland, MI (US); Scott A. Mollema, Rockford, MI (US); Karlis Vecziedins, Caledonia, MI (US)

(73) Assignee: Access Business Group International LLC, Ada, MI (US)

( * ) Notice: Subject to any disclaimer, the term of this patent is extended or adjusted under 35 U.S.C. 154(b) by 0 days.

(21) Appl. No.: 10/886,380

(22) Filed: Jul. 7, 2004

(65) Prior Publication Data

US 2006/0006814 A1    Jan. 12, 2006

(51) Int. Cl.
    *H05B 37/00*    (2006.01)
(52) U.S. Cl. ...................... 324/414; 324/713
(58) Field of Classification Search ..................... None
    See application file for complete search history.

(56) References Cited

U.S. PATENT DOCUMENTS

| | | | |
|---|---|---|---|
| 3,794,882 A | 2/1974 | Kitanosono | |
| 3,949,268 A | 4/1976 | von Mangoldt | |
| 4,112,428 A * | 9/1978 | Dorsman | ..................... 341/158 |
| 4,458,136 A | 7/1984 | Wagatsuma | |
| 4,808,877 A | 2/1989 | Netten et al. | |
| 5,105,119 A | 4/1992 | Dayton | |
| 5,264,997 A | 11/1993 | Hutchisson et al. | |
| 5,345,149 A | 9/1994 | Ham | |
| 5,877,621 A | 3/1999 | Beyers et al. | |
| 6,396,289 B1 * | 5/2002 | Schmitt | ...................... 324/713 |
| 6,407,511 B1 * | 6/2002 | Yang et al. | .................. 315/224 |
| 2003/0189429 A1 * | 10/2003 | Belenger et al. | ............ 324/414 |

FOREIGN PATENT DOCUMENTS

GB    1118557 A1    7/1968

OTHER PUBLICATIONS

Dimino, Chris, New Starting Technology Can Increase Lamp Life by 50 Percent, downloaded from http://www.universalballast.com/literature/newstart.html on Jun. 22, 2004.
Guide to Selecting Frequently Switched T8 Fluorescent Lamp-Ballast Systems, Nat'l Lighting Product Information Program, Copyright 1998 Rensselaer Polytechnic Institute.

* cited by examiner

*Primary Examiner*—David Vu
(74) *Attorney, Agent, or Firm*—Warner, Norcross & Judd LLP

(57) ABSTRACT

A system for automated testing of the lamp filaments has an ohm meter. The ohm meter is used to determine the resistance of the lamp filament prior to energizing the lamp. A multiplexer switches the ohm meter from one lamp filament to the next so that the lamp filaments are quickly and accurately tested. After the cold resistance of the lamp filaments is measured, a power supply energizes the lamp filaments.

17 Claims, 2 Drawing Sheets

SYSTEM AND METHOD FOR AUTOMATED FILAMENT TESTING OF GAS DISCHARGE LAMPS

BACKGROUND OF THE INVENTION

Prior to the illumination of some gas discharge lamps, a small current is passed through the lamps to warm the filaments. This filament preheating allows the strike voltage for the lamp to be lowered, thereby allowing the lamp to light almost immediately when the strike voltage is applied.

In order to apply the optimum amount of current to warm the filaments, the resistance of the filament is often measured. The resistance of the filament prior to preheating is referred to as "rcold." The resistance of the filament after it has been warmed is referred to as "rhot." The ratio of rhot to rcold is often referred to as Rh/Rc. Knowing the approximate value of rhot and rcold for lamps allows ballasts to be designed specifically for the lamps.

Measurement of the rhot and rcold for a lamp is a complex process. In order to ascertain the rhot for a lamp, a technician measures the resistance of the lamp filament with an ohm meter. To obtain rhot, the lamp is attached to an oscilloscope. A current is applied to each lamp filament. After a short length of time, the voltage across the filament is then measured. From the measurements of current and voltage, the resistance of the lamp filament is obtained.

While this method of measuring rhot and rcold is effective, it has shortcomings. First, the measurement process is very time consuming. Thus, only a few lamps are tested for rhot and rcold. Second, the process measures rhot only after the lamp filament has been fully heated. Therefore, possible problems with the heating of the lamp filament prior to the time it is fully heated are not revealed.

An improved method of determining rhot and rcold which is less time consuming and provides more information about the relationship between rhot and rcold is thus highly desirable.

SUMMARY OF THE INVENTION

A system for automated testing of the lamp filaments includes an ohm meter. The ohm meter is used to determine the resistance of the lamp filament prior to energizing the lamp. A multiplexer switches the ohm meter from one lamp filament to the next so that the lamp filaments are quickly and accurately tested. After the cold resistance of the lamp filaments is measured, a power supply attached to the lamps is enabled, thereby energizing the lamp filaments.

A current sensor connected to the lamp filaments measures the current through the filaments while a voltmeter also connected to the lamps measures the voltage across the filaments. The output from the current sensor and voltmeter is digitized and provided to a computer. The computer makes several readings from the two sensors as current is supplied to the filaments. The computer calculate the resistance of the lamp filament at various times during the heating of the filament.

When the lamp filaments are fully heated, the measurement process is terminated. The computer then constructs a chart of the heating characteristics of the lamp filaments from the cold resistance data and the resistance of the filament during heating.

By using a computer to monitor the heating of the filaments, the process can be fully automated. Thus, a visual display such as a bar chart can be constructed showing the characteristics of the lamp.

In addition to providing important information regarding the lamp, the visual display of the data can indicate problems with the construction of the filaments, thereby improving the quality of lamps.

These and other objects, advantages and features of the invention will be more readily understood and appreciated by reference to the detailed description of the drawings.

DETAILED DESCRIPTION OF THE DRAWINGS

Figure 1:
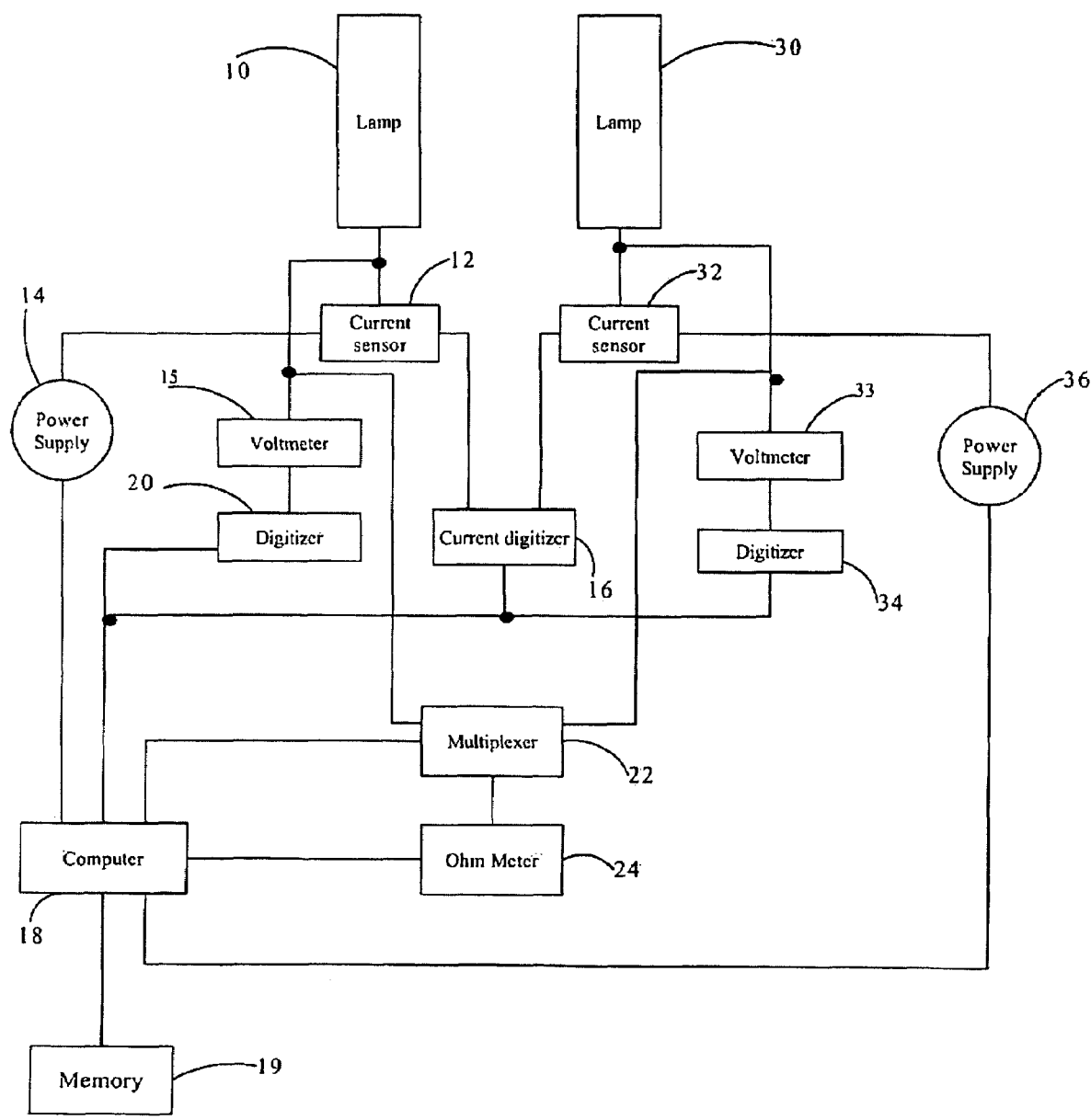
FIG. 1 is a block diagram for a system for automatic lamp testing.

FIG. 1 shows a system for automatic lamp testing. Lamp 10 has several lamp filaments. Lamp 10 is connected to current sensor 12. Current sensor 12 measures the current passing through the filaments of lamp 10 from power supply 14. Power supply 14 could be a ballast. The output of current sensor 12 is coupled to current digitizer 16. Current digitizer 16 could be a current sensor oscilloscope. The output of current sensor oscilloscope is connected to computer 18. Computer 18 could be a personal computer or it could be a module capable of storing or analyzing all of the data collected by the system, and controlling system input and output.

When a current from power supply 14 flows through current sensor 12 and through the filaments of lamp 10, the output from current sensor 12 is digitized by current digitizer 16. The output from current digitizer 16 is coupled to computer 18. Computer 18 is connected to memory 19. Memory 19 could be resident within computer 18 or memory 19 could be an external data storage device.

Voltmeter 15 is also coupled to the terminals of lamp 10. Digitizer 20 converts the output from voltmeter 15 into a digital voltage. Digitizer 20 and voltmeter 15 could be a single integral unit, such as an oscilloscope. Voltmeter 15 detects the voltage across the filament of lamp 10. The output of digitizer 20 is connected to computer 18. Computer 18 also records the voltage across the lamp filaments simultaneously with the recording of the current through the lamp filaments. Computer 18 thus can compute the resistance of the filaments.

It would be possible to calculate rcold for lamp 10 as described above. However, due to the relatively quick heating of the filaments, it has been found that a separate method for measuring rcold is preferred. Multiplexer 22 selectively connects ohm meter 24 to the lamp filaments. Ohm meter 24 is preferably a four ohm meter. The digital output of the ohm meter is also connected to computer 18.

As shown in FIG. 1, lamp 30, current sensor 32, voltmeter 33, digitizer 34 and power supply 36 are connected similarly to lamp 10, current sensor 12, digitizer 20, and power supply 14. Voltmeter 33 and digitizer 34 could be combined as a voltage digitizer. Voltmeters 15, 33 and digitizer 20, 34 could be combined into a single instrument.

Figure 2:
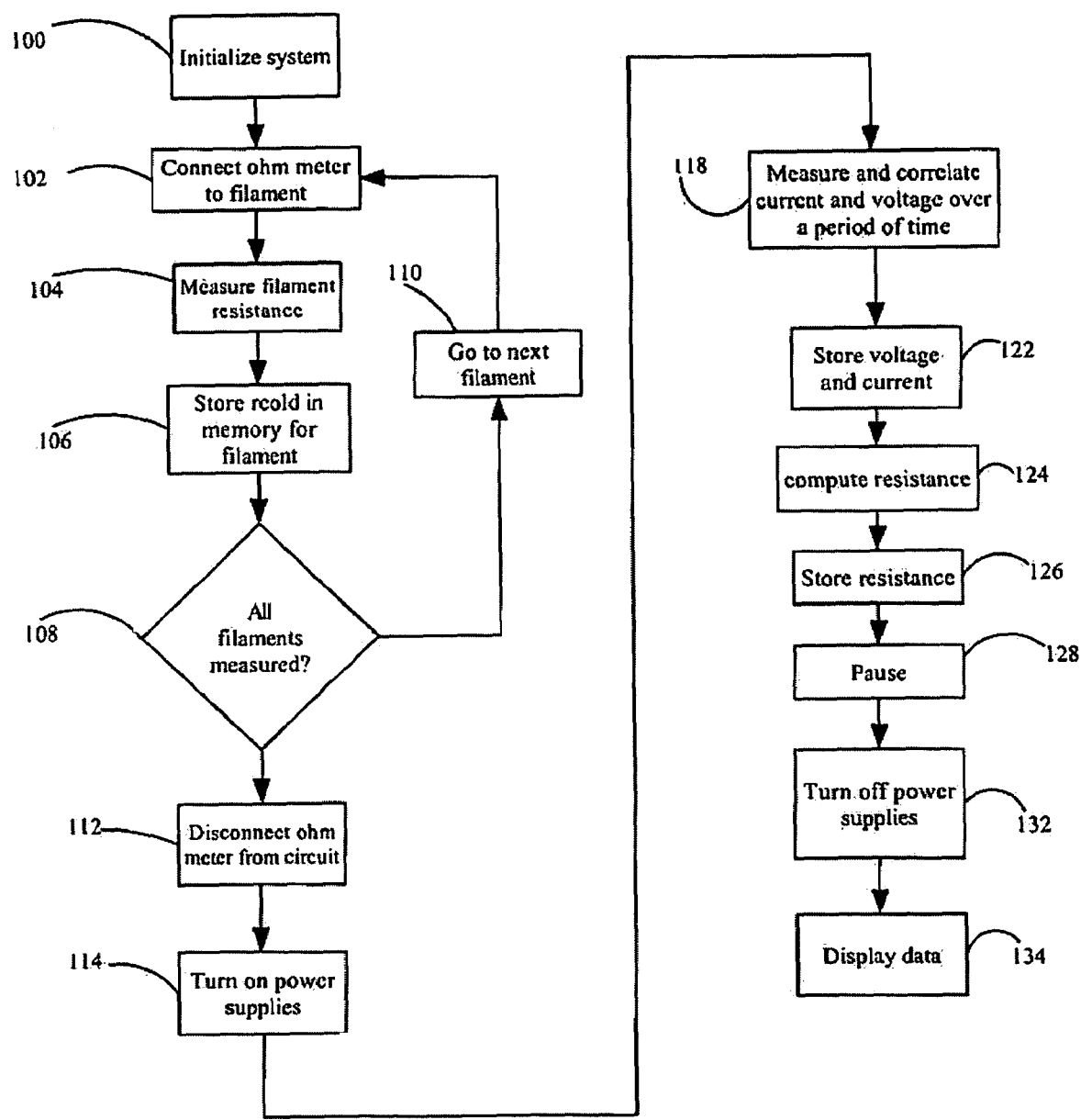
FIG. 2 is a method of automatic lamp testing.

FIG. 2 shows a method of operating the system. Once lamps 10, 30 are placed within the system and the system is initialized (step 100), multiplexer 22 connects ohm meter 24 to the first filament. Step 102. Rcold is then measured (step 104), and stored in memory 19. Step 106. If all filaments have not been measured (step 108), computer 18 instructs multiplexer 22 to connect next filament to ohm meter 24. Step 110.

If all of the filaments have been measured, ohm meter 24 is removed from the circuit by multiplexer 22. Step 112. The power supplies are then turned on. Step 114.

The current and voltage is measured and correlated over a period of time. Step 118. The voltage and current are then stored. Step 122. The resistance is computed (step 124) and stored in memory. Step 126.

The system may then pause for a short period of time. Step 128. The length of the pause is dependent upon the number of samples desired during the filament heating.

The process terminates. Step 132. The data can then be displayed or printed in many different formats. Step 134.

Alternatively, if the filament measurement system were placed into an assembly line, lamps which fail to meet standards for rcold and rhot could be rejected as defective.

There are many uses for the data. One use for the data is to accumulate the results of the data for a large number of lamps and then statistically display the results. This would thus show the quality of produced lamps with reference to rcold and rhot.

The above description is of the preferred embodiment. Various alterations and changes can be made without departing from the spirit and broader aspects of the invention as defined in the appended claims, which are to be interpreted in accordance with the principles of patent law including the doctrine of equivalents. Any references to claim elements in the singular, for example, using the articles "a," "an," "the," or "said," is not to be construed as limiting the element to the singular.

The embodiments of the invention in which an exclusive property or privilege is claimed are defined as follows:

1. A system for automated filament testing of a fluorescent lamp, the fluorescent lamp having a first filament and a second filament, comprising:
   an ohm meter, selectively coupled to one of the first filament and the second filament by a multiplexer, the ohm meter measuring a first filament resistance for each of the first filament and the second filament;
   a computer coupled to the ohm meter; and
   a memory coupled to the computer for recording the first filament resistance for each of the first filament and the second filament.

2. The system of claim 1 further comprising:
   a current sensor coupled the first filament and the second filament, the current sensor having a current sensor output, the current sensor output coupled to the computer;
   a voltmeter coupled to the first filament and the second filament, the voltmeter having a voltmeter output, the voltmeter output coupled to the computer, wherein the computer stores the voltmeter output and the current sensor output;
   a power supply for energizing the first filament and the second filament;
   and wherein the computer calculates a second filament resistance for each of the first filament and second filament after the first filament and second filament have been energized by the power supply.

3. The system of claim 2 where the voltmeter and current sensor take a plurality of voltmeter readings and current sensor readings, and the computer computes a filament resistance for each pair of voltmeter readings and current sensor readings thereby creating a plurality of filament resistances.

4. The system of claim 3 where the computer displays the plurality of filament resistances.

5. The system of claim 4 further comprising:
   a current digitizer for digitizing the current sensor output.

6. The system of claim 5 where the power supply is a ballast.

7. The system of claim 6 where the voltmeter and the voltage digitizer are an integral unit.

8. The system of claim 6 further comprising:
   a second lamp, the second lamp having second lamp filaments;
   a second current sensor coupled to the second lamp filaments for measuring a second lamp filament current through the second lamp filaments;
   a second voltmeter coupled to the second lamp filaments for measuring a second lamp filament voltage across the second lamp filaments; and
   a second power supply for energizing the second lamp filaments.

9. The system of claim 8 wherein the multiplexer selectively couples the ohm meter to the second lamp filaments to measure a second lamp resistance for each of the second lamp filaments.

10. A method for automated testing of a first lamp having first lamp filaments:
    providing an ohm meter;
    multiplexing the ohm meter with each of the first lamp filaments;
    measuring a cold lamp filament resistance for each of the first lamp filaments; and
    storing the cold lamp filament resistance for each of the first lamp filaments in a memory.

11. The method of claim 10 further comprising:
    energizing the lamp filaments in order to heat the filaments;
    before the lamp filaments are fully heated, measuring the current and voltage for each of the first lamp filaments for a plurality of times; and
    storing the measured current voltage for each of the first lamp filaments and the second lamp filaments in memory.

12. The method of claim 11 further comprising
    using a computer, calculating a filament resistance for each of the plurality of times; and
    using the computer to construct a graphical representation of the resistance of the first lamp filaments from a combination of the cold lamp filament resistance and the computed filament resistance for each of the plurality of time segments.

13. A method for automated testing of a fluorescent lamp having a first filament and second filament comprising:
    measuring the resistance of the first filament before the first filament is heated;
    applying a voltage to the first filament in order to heat the first filament;
    measuring the resistance of the first filament at least once before the first filament is fully heated; and
    measuring the resistance of the first filament after the first filament is fully heated.

14. The method of claim 13 further comprising:
    measuring the resistance of the second filament before the second filament is heated;
    applying a voltage to the second filament in order to heat the second filament;
    measuring the resistance of the second filament at least once before the second filament is fully heated; and measuring the resistance of the second filament after the second filament is fully heated.

15. The method of claim 14 further comprising:
providing an ohmmeter to measure the resistance of the first filament before the first filament is heated.

16. The method of claim 15 where the step of measuring the resistance of the first filament after the first filament is fully heated comprises:
measuring a current through the first filament after the first filament is fully heated;
measuring a voltage across the first filament after the first filament is fully heated; and
computing the resistance of the first filament from the current and the voltage.

17. The method of claim 13 where the step of measuring the resistance of the first filament after the first filament is fully heated comprises:
measuring a current through the first filament after the first filament is fully heated;
measuring a voltage across the first filament after the first filament is fully heated;
computing the resistance of the first filament from the current and the voltage; and
storing the measured current voltage for each of the first lamp filament and the second lamp filament in memory.

* * * * *